United States Patent
Bollesen (12)

(10) Patent No.: US 6,275,380 B1
(45) Date of Patent: Aug. 14, 2001

(54) ADD-ON HEAT SINK AND METHOD

(75) Inventor: Vernon P. Bollesen, Milpitas, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/515,251

(22) Filed: Feb. 29, 2000

(51) Int. Cl.$^7$ .................................................... H05K 7/20
(52) U.S. Cl. .................. 361/704; 361/707; 361/709; 361/712; 361/719; 257/719; 257/718; 257/727; 174/16.3; 165/80.2; 165/80.3
(58) Field of Search ............................ 361/688–690, 361/694, 695, 697, 703, 704, 707, 709, 717, 720; 257/718, 719, 726, 727; 174/16.1, 16.3; 1655/80.2, 80.3, 185

(56) References Cited

U.S. PATENT DOCUMENTS

| | | | | |
|---|---|---|---|---|
| 4,800,956 | * | 1/1989 | Hamburgen | 165/185 |
| 4,972,294 | | 11/1990 | Moses, Jr. et al. | 361/386 |
| 5,077,638 | | 12/1991 | Andersson et al. | 361/388 |
| 5,184,281 | * | 2/1993 | Samarov et al. | 361/704 |
| 5,208,731 | | 5/1993 | Blomquist | 361/386 |
| 5,253,702 | | 10/1993 | Davidson et al. | 165/80.4 |
| 5,276,585 | | 1/1994 | Smithers | 361/704 |
| 5,307,239 | | 4/1994 | McCarty et al. | 361/704 |
| 5,329,426 | | 7/1994 | Villani | 361/719 |
| 5,329,993 | | 7/1994 | Ettehadieh | 165/104.14 |
| 5,343,362 | | 8/1994 | Solberg | 361/710 |
| 5,367,193 | | 11/1994 | Malladi | 257/707 |
| 5,373,099 | | 12/1994 | Boitard et al. | 174/16.3 |
| 5,423,375 | | 6/1995 | Chiou | 165/80.3 |
| 5,484,013 | * | 1/1996 | Morikawa et al. | 165/80.3 |
| 5,570,271 | | 10/1996 | Lavochkin | 361/704 |
| 5,586,005 | | 12/1996 | Cipolla et al. | 361/719 |
| 5,621,244 | | 4/1997 | Lin | 257/713 |
| 5,699,229 | | 12/1997 | Brownell | 361/719 |
| 5,748,446 | | 5/1998 | Feightner et al. | 361/709 |
| 5,761,041 | | 6/1998 | Hassanzadeh et al. | 361/704 |
| 5,847,928 | | 12/1998 | Hinshaw et al. | 361/704 |
| 5,881,800 | | 3/1999 | Chung | 165/80.3 |
| 5,884,692 | | 3/1999 | Lee et al. | 165/80.3 |
| 5,889,653 | * | 3/1999 | Clemens | 361/704 |
| 5,959,350 | | 9/1999 | Lee et al. | 257/712 |
| 5,990,552 | * | 11/1999 | Xie et al. | 257/718 |
| 5,991,151 | | 11/1999 | Capriz | 361/704 |
| 5,991,154 | * | 11/1999 | Clemens et al. | 361/704 |
| 6,053,240 | * | 4/2000 | Johnston et al. | 361/704 |
| 6,093,961 | * | 7/2000 | McCullough | 257/718 |
| 6,109,340 | * | 8/2000 | Nakase et al. | 165/80.3 |

* cited by examiner

*Primary Examiner*—Leo P. Picard
*Assistant Examiner*—Boris L. Chervinsky
(74) *Attorney, Agent, or Firm*—Gunnison McKay & Hodgson, L.L.P.; Serge J. Hodgson

(57) ABSTRACT

A heat sink structure includes first and second add-on heat sinks mounted to a primary heat sink. The add-on heat sinks are thermally connected to the primary heat sink such that the effective heat transfer surface area for dissipating heat to the ambient environment is increased compared to the surface area of the primary heat sink alone. Increasing the effective heat transfer surface area enhances heat transfer from the primary heat sink. The add-on heat sinks also restrict air from flowing between the primary heat sink and a cabinet of the computer system. In this manner, the add-on heat sinks force air to flow between the fins of the primary heat sink, thus further enhancing heat transfer from the primary heat sink.

27 Claims, 4 Drawing Sheets

ADD-ON HEAT SINK AND METHOD

FIELD OF THE INVENTION

The present invention relates generally to cooling of electronic components in electronic devices. More particularly, the present invention relates to the removable attachment of an additional heat sink to a primary heat sink of an electronic device.

BACKGROUND OF THE INVENTION

As the art moves towards higher power integrated circuits and components, hereinafter referred to as heat emitting components, heat transfer from the heat emitting components becomes increasingly difficult and more important. One conventional technique used to remove heat from a heat emitting component was to employ a finned heat sink which was placed in thermal contact with the heat emitting component. In this manner, heat generated by the heat emitting component was conducted to the heat sink and then dissipated to the ambient environment.

FIG. 1 is a front plan view of a heat sink structure 10 in accordance with the prior art. Heat sink structure 10 included a finned heat sink 12 in thermal contact with a heat emitting component 14. During use, heat emitting component 14 generated heat. This heat was conducted to heat sink 12, which dissipated this heat to the ambient environment.

To provide the greatest flexibility in the use of heat sink 12, fins 16 of heat sink 12 were made relatively short. In this manner, heat sink 12 could be used in a variety of different computer systems having a variety of different spacings between the cabinet and a printed circuit board 20, to which heat emitting component 14 was attached. To illustrate, by forming relatively short fins 16, heat sink 12 could be used with a cabinet 18 (indicated in dashed lines), which was spaced relatively close to printed circuit board 20. Further, heat sink 12 could be readily used with a cabinet 22, which was space relatively far from printed circuit board 20.

When used with cabinet 18, heat sink 12 was relatively effective at dissipating heat from heat emitting component 14. In particular, air was forced to flow between fins 16 due to the relatively small spacing between printed circuit board 20 and cabinet 18.

However, when used with cabinet 22, heat sink 12 was relatively ineffective at dissipating heat from heat emitting component 14. In particular, since air follows a path of least resistance, the air had a tendency to flow between heat sink 12 and cabinet 22 instead of between fins 16.

To provide adequate cooling of heat emitting component 14 when used with cabinet 22, heat sink 12 could be replaced with another heat sink having longer fins. Disadvantageously, since the spacing between cabinet 22 and printed circuit board 20 varied depending upon the particular manufacturer, a large number of different heat sinks had to be stocked to accommodate the different manufacturer specifications. To avoid the complexity and cost associated with stocking a large number of different heat sinks, heat sink 12 having relatively short fins 16 was used for all manufacturers regardless of the spacing between cabinet 22 and printed circuit board 20.

To enhance heat dissipation from heat sink 12 when the spacing between cabinet 22 and printed circuit board 20 was relatively large, additional and/or more powerful fans were used. However, to avoid excess power consumption and to avoid exceeding noise level limits, the size of these additional and/or more powerful fans was severely restricted.

Accordingly, the art needs a method of enhancing heat transfer from a heat emitting component using a heat sink having relatively short fins without having to providing additional and/or more powerful fans.

SUMMARY OF THE INVENTION

In accordance with the present invention, a heat sink structure includes first and second add-on heat sinks mounted to a primary heat sink. The primary heat sink is in thermal contact with a heat emitting component. The add-on heat sinks enhance heat transfer from the primary heat sink in several ways. First, since the add-on heat sinks are thermally connected to the primary heat sink, the effective heat transfer surface area for dissipating heat to the ambient environment is increased compared to the surface area of the primary heat sink alone. Increasing the effective heat transfer surface area increases heat dissipation to the ambient environment.

The add-on heat sinks also enhance heat transfer from the primary heat sink by improving airflow between fins of the primary heat sink. More particularly, the add-on heat sinks restrict air from flowing between the primary heat sink and a cabinet, which is spaced relatively far from a substrate, e.g., printed circuit board, to which the heat emitting component is attached. In this manner, the add-on heat sinks force air to flow between the fins of the primary heat sink, thus enhancing heat transfer from the primary heat sink.

Advantageously, the add-on heat sinks enhance heat transfer from the primary heat sink when the spacing between the cabinet and the printed circuit board is sufficiently large such that the primary heat sink would otherwise be ineffective at cooling the heat emitting component. By enhancing heat transfer from the primary heat sink, the add-on heat sinks ensure that the temperature of the heat emitting component remains below the maximum allowable operating temperature of the heat emitting component.

However, in the event that the spacing between the cabinet and the printed circuit board is sufficiently small such that the primary heat sink alone is effective at cooling the heat emitting component, the add-on heat sinks are not provided.

Advantageously, the primary heat sink is used with all spacings between the cabinet and the printed circuit board. In the event that the spacing between the cabinet and the printed circuit board becomes sufficiently large such that the primary heat sink alone would be ineffective at cooling the heat emitting component, only then are the add-on heat sinks provided. Accordingly, only a single primary heat sink is stocked for all manufacturers.

Recall that in the prior art, a large number of different heat sinks had to be stocked to accommodate the different spacings between the cabinet and the printed circuit board for the various manufacturers. Disadvantageously, stocking a large number of different heat sinks was cost prohibitive.

Alternatively, in the prior art, a single heat sink having relatively short fins was used for all manufacturers regardless of the spacing between the cabinet and the printed circuit board. To enhance heat transfer from the heat emitting component and heat sink when the spacing between the cabinet and printed circuit board became relatively large, additional and/or more powerful fans were used. Disadvantageously, these additional and/or more powerful fans consumed more power, which increased the operating cost of the computer system. Further, these additional and/or more powerful fans resulted in an increase in noise, which was detrimental to the performance of the computer system.

In contrast, the heat sink structure in accordance with the present invention provides effective cooling of the heat emitting component even when the spacing between the cabinet and the printed circuit board becomes relatively large. Effective cooling of the heat emitting component is achieved using only a single primary heat sink for all manufacturers. Further, effective cooling of the heat emitting component is achieved without having to power a fan and without generating noise. Accordingly, the prior art requirements of stocking a large number of heat sinks and providing additional and/or more powerful fans are eliminated.

In one embodiment, a simple yet reliable method of mounting an add-on heat sink to a primary heat sink is presented. To mount the add-on heat sink to the primary heat sink, the add-on heat sink is positioned such that locking features of the add-on heat sink are substantially aligned with sides of the primary heat sink.

The add-on heat sink is pressed towards the primary heat sink. This causes a first arm of the add-on heat sink to be spread apart from a second arm of the add-on heat sink. The arms are moved downwards until the locking features are locked to a base section of the primary heat sink. Of importance, tension in the arms causes a body portion of the add-on heat sink to press downwards on an upper surface of the primary heat sink. In this manner, the add-on heat sink is pressed into thermal contact with the primary heat sink.

Advantageously, mounting the add-on heat sink to the primary heat sink is simple. Accordingly, the costs associated with mounting the add-on heat sink to the primary heat sink are minimal. Further, the add-on heat sink is mounted without making any modifications to the primary heat sink. Thus, by properly sizing the add-on heat sink, the add-on heat sink can be readily used with a wide variety of commercially available primary heat sinks.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
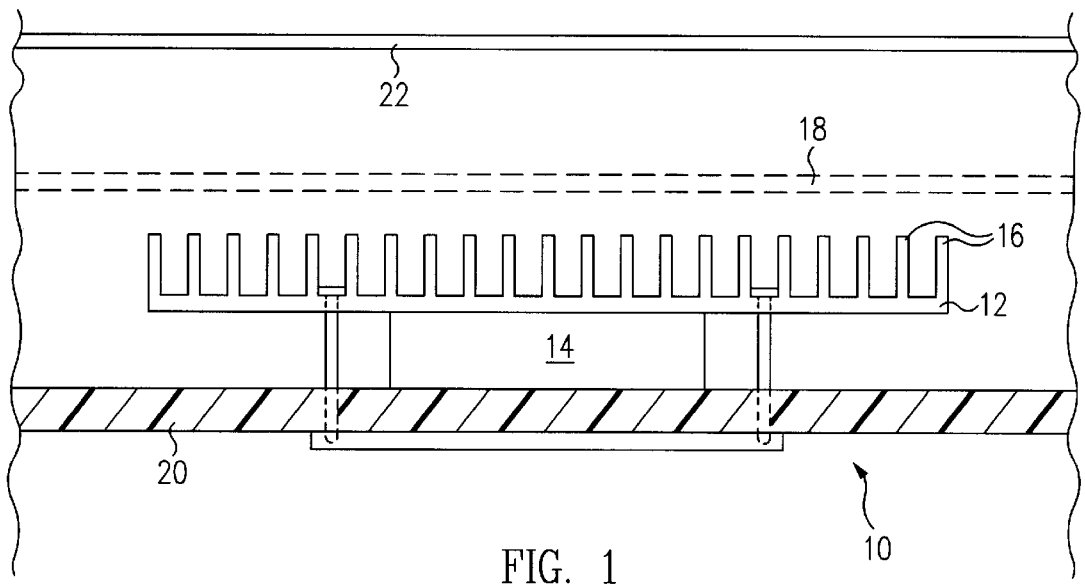
FIG. 1 is a front plan view of a heat sink structure in accordance with the prior art.

In accordance with the present invention, first and second add-on heat sinks 240A, 240B (FIGS. 2, 3A) are mounted to a primary heat sink 214. Add-on heat sinks 240A, 240B enhance heat transfer from primary heat sink 214 in several ways. First, since add-on heat sinks 240A, 240B are thermally connected to primary heat sink 214, the effective heat transfer surface area for dissipating heat to the ambient environment is increased compared to the surface area of primary heat sink 214 alone. Increasing the effective heat transfer surface area increases heat dissipation to the ambient environment.

Add-on heat sinks 240A, 240B also enhance heat transfer from primary heat sink 214 by improving airflow between fins 228 of primary heat sink 214. More particularly, add-on heat sinks 240A, 240B restrict air from flowing between primary heat sink 214 and a cabinet 260, which is spaced relatively far from a substrate 212 such as a printed circuit board. In this manner, add-on heat sinks 240A, 240B force air to flow between fins 228 of primary heat sink 214, thus enhancing heat transfer from primary heat sink 214.

Advantageously, add-on heat sinks 240A, 240B enhance heat transfer from primary heat sink 214 when the spacing between cabinet 260 and substrate 212 is sufficiently large such that primary heat sink 214 would otherwise be ineffective at cooling heat emitting component 210. By enhancing heat transfer from primary heat sink 214, add-on heat sinks 240A, 240B ensure that the temperature of heat emitting component 210 remains below the maximum allowable operating temperature of heat emitting component 210.

However, in the event that the spacing between cabinet 260 and substrate 212 is sufficiently small such that primary heat sink 214 alone is effective at cooling heat emitting component 210, add-on heat sinks 240A, 240B are not provided.

Advantageously, primary heat sink 214 is used with all spacings between cabinet 260 and substrate 212. In the event that the spacing between cabinet 260 and substrate 212 becomes sufficiently large such that primary heat sink 214 alone would be ineffective at cooling heat emitting component 210, only then are add-on heat sinks 240A, 240B provided. Accordingly, only a single primary heat sink 214 is stocked for all manufacturers.

Recall that in the prior art, a large number of different heat sinks had to be stocked to accommodate the different spacings between the cabinet and the substrate for the various manufacturers. Disadvantageously, stocking a large number of different heat sinks was cost prohibitive.

Alternatively, in the prior art, a single heat sink having relatively short fins was used for all manufacturers regardless of the spacing between the cabinet and the substrate. To enhance heat transfer from the heat emitting component and heat sink when the spacing between the cabinet and printed circuit board became relatively large, additional and/or more powerful fans were used. Disadvantageously, these additional and/or more powerful fans consumed more power, which increased the operating cost of the computer system. Further, these additional and/or more powerful fans resulted in an increase in noise, which was detrimental to the performance of the computer system.

In contrast, heat sink structure 200 provides effective cooling of heat emitting component 210 even when the spacing between cabinet 260 and substrate 212 becomes relatively large. Effective cooling of heat emitting component 210 is achieved using only a single primary heat sink 214 for all manufacturers. Further, effective cooling of heat emitting component 210 is achieved without having to power a fan and without generating noise. Accordingly, the prior art requirements of stocking a large number of heat sinks and providing additional and/or more powerful fans are eliminated.

Figure 6:
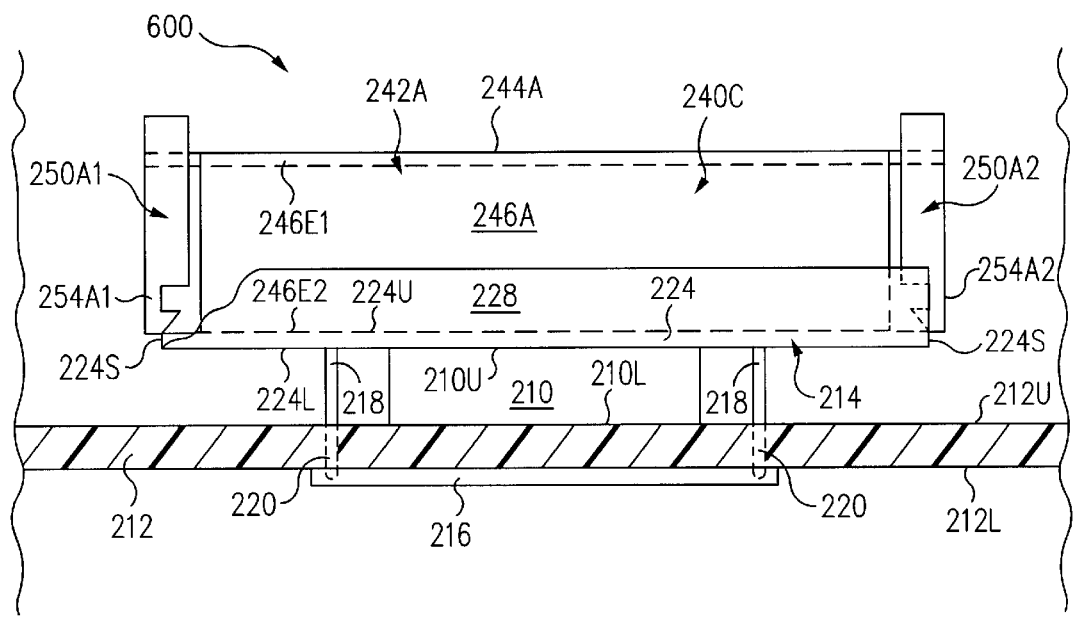
FIG. 6 is a side plan view of a heat sink structure formed with the add-on heat sink of FIGS. 4, 5 during assembly in accordance with one embodiment of the present invention.

Referring now to FIG. 6, in one embodiment, an add-on heat sink 240C is mounted to primary heat sink 214 in a simple yet reliable manner. To mount add-on heat sink 240C to primary heat sink 214, add-on heat sink 240C is positioned such that locking features 254A1, 254A2 are substantially aligned with sides 224S of primary heat sink 214.

Figure 7:
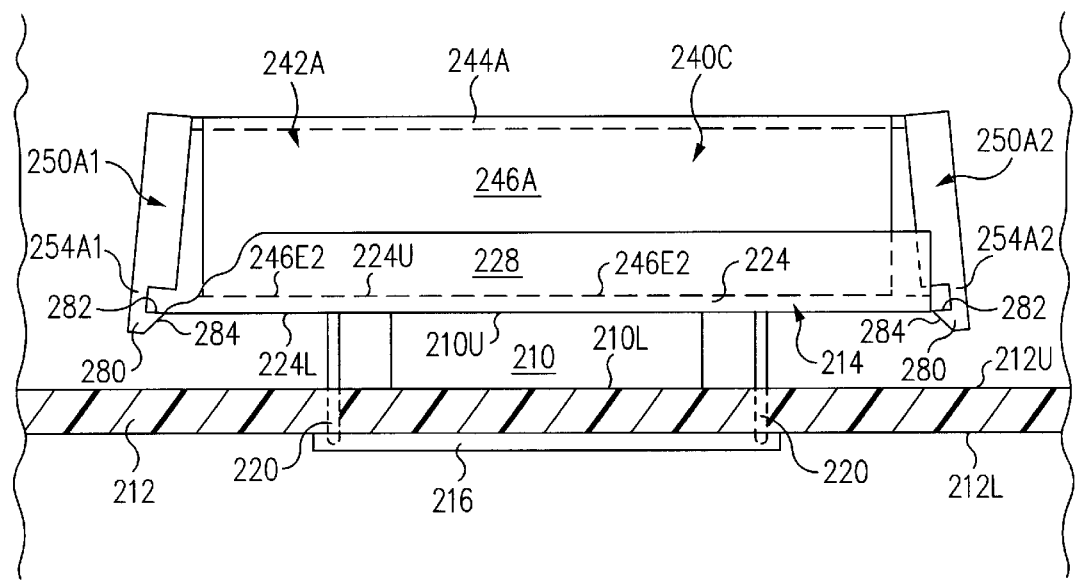
FIG. 7 is a side plan view of the heat sink structure of FIG. 6 at a further stage of assembly.

Referring now to FIG. 7, add-on heat sink 240C is pressed towards primary heat sink 214. This causes an arm 250A1 to be spread apart from a second arm 250A2. Arms 250A1, 250A2 are moved downwards until locking features 254A1, 254A2 are locked to base section 224 of primary heat sink 214. Of importance, tension in arms 250A1, 250A2 causes a body portion 242A of add-on heat sink 240C to press downwards on upper surface 224U of primary heat sink 214. In this manner, add-on heat sink 240C is pressed into thermal contact with primary heat sink 214.

Advantageously, mounting add-on heat sink 240C to primary heat sink 214 is simple. Accordingly, the cost associated with mounting add-on heat sink 240C to primary heat sink 214 are minimal. Further, add-on heat sink 240C is mounted without making any modifications to primary heat sink 214. Thus, by properly sizing add-on heat sink 240C, add-on heat sink 240C can be readily used with a wide variety of commercially available primary heat sinks.

Figure 2:
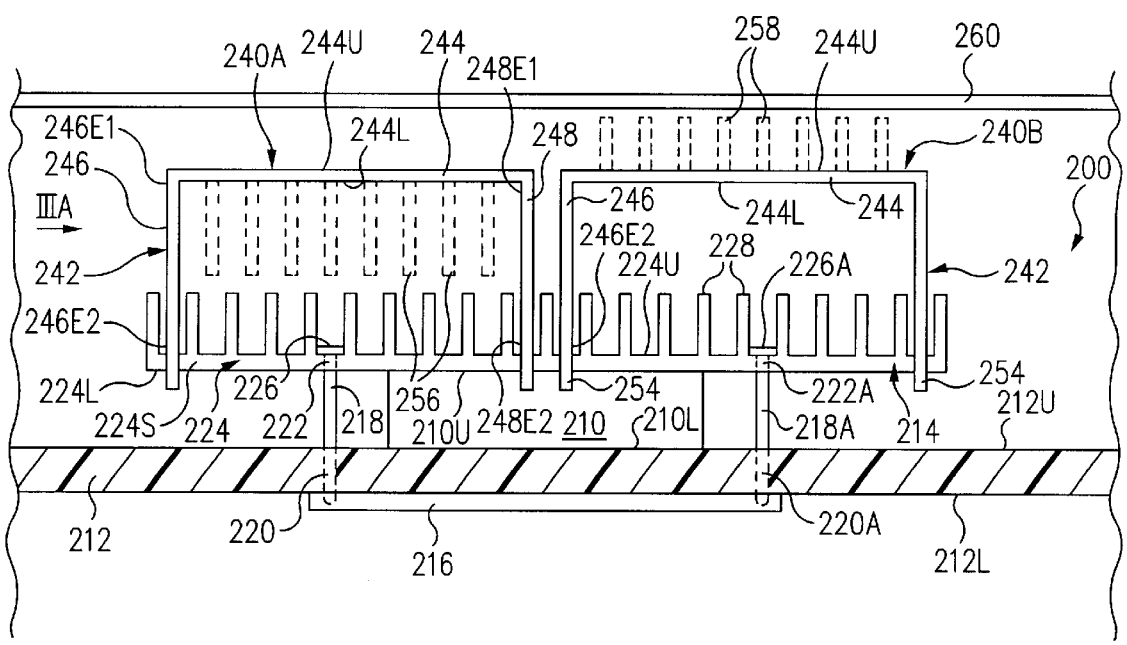
FIG. 2 is a front plan view of a heat sink structure in accordance with the present invention.
Figure 3A:
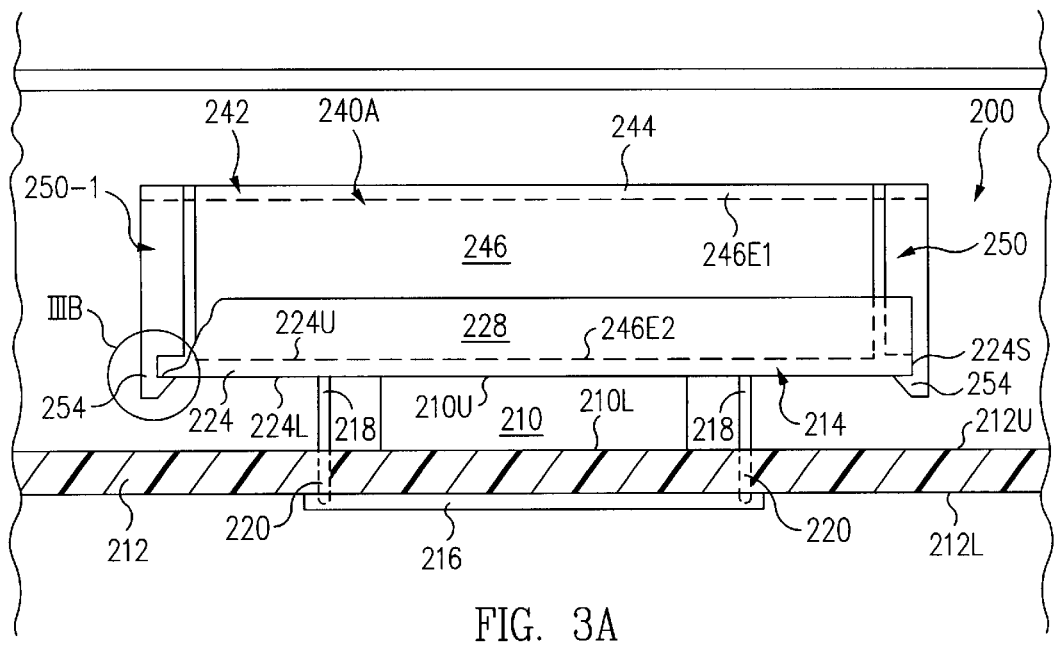
FIG. 3A is a side plan view, partially cutaway, along the line IIIA of the heat sink structure of FIG. 2.

More particularly, FIG. 2 is a front plan view of a heat sink structure 200 in accordance with the present invention. FIG. 3A is a side plan view, partially cutaway, along the line IIIA of heat sink structure 200 of FIG. 2. Referring to FIGS. 2 and 3A together, a lower, e.g., first, surface 210L of a heat emitting component 210 is attached to an upper, e.g., first, surface 212U of a substrate 212 such as a printed circuit board. A lower, e.g., first, surface 224L of a base section 224 of a primary heat sink 214 is in thermal contact with an upper, e.g., second, surface 210U of heat emitting component 210. Primary heat sink 214 further includes a plurality of fins 228 on an upper, e.g., second, surface 224U of base section 224 of primary heat sink 214. Fins 228 extend upwards, e.g., in a first direction, from base section 224.

A bolster plate 216 is positioned opposite of heat emitting component 210 on a lower, e.g., second, surface 212L of substrate 212. Extending upwards from bolster plate 216 are a plurality of pins 218. For example, bolster plate 216 is rectangular when viewed from below and a pin 218 is located at each corner of bolster plate 216 for a total of four pins 218.

Pins 218 pass through corresponding apertures 220 in substrate 212 and through corresponding apertures 222 in base section 224 of primary heat sink 214. Heads 226 of pins 218 press downwards, e.g., in a second direction opposite the first direction, on upper surface 224U of primary heat sink 214.

To illustrate, a first pin 218A of the plurality of pins 218 passes through a first aperture 220A of the plurality of apertures 220. Pin 218A further passes through a first aperture 222A of the plurality of apertures 222. A head 226A of pin 218A press downwards on upper surface 224U of base section 224 of primary heat sink 214. The other pins 218 pass through corresponding apertures 220 and corresponding apertures 222 and have corresponding heads 226 which press downwards on upper surface 224U in a similar manner and so are not discussed further to avoid detracting from the principals of the invention.

Heat emitting component 210 is attached to upper surface 212U of substrate 212 in a conventional manner. For example, heat emitting component 210 is a ball grid array or a pin grid array type component. By positioning heat emitting component 210 and substrate 212 between primary heat sink 214 and bolster plate 216, primary heat sink 214 is pressed into thermal contact with heat emitting component 210.

In one embodiment, heat emitting component 210 is held in place on substrate 212 by primary heat sink 214. For example, heat emitting component 210 includes a land grid array type central processing unit (CPU) and a socket, which is located between the CPU and substrate 212. In one embodiment, heat emitting component 210 includes a thermal pad and/or thermal grease between the CPU and primary heat sink 214. Suitable CPUs, sockets, thermal pads and/or thermal greases are well known to those of skill in the art and are not illustrated in the figures or discussed further for purposes of clarity.

Attached to primary heat sink 214 is a first add-on heat sink 240A and a second add-on heat sink 240B. Paying particular attention to add-on heat sink 240A, add-on heat sink 240A includes an inverted U-shaped body portion 242. In this embodiment, body portion 242 includes a base section 244, which is substantially parallel with upper surface 224U of primary heat sink 214.

Extending downwards from base section 244 of add-on heat sink 240A is a first heat conductor wall 246 and a second heat conductor wall 248. Walls 246, 248 are substantially perpendicular to a lower, e.g., first, surface 244L of base section 244. Further, walls 246, 248 extend between base section 244 of add-on heat sink 240A and base section 224 of primary heat sink 214. Walls 246, 248 fit between fins 228 of primary heat sink 214.

More particularly, a first end 246E1 of wall 246 is attached to base section 244 of add-on heat sink 240A and a second end 246E2 of wall 246 presses downwards on upper surface 224U of primary heat sink 214. Similarly, a first end 248E1 of wall 248 is attached to base section 244 of add-on heat sink 240A and a second end 248E2 of wall 248 presses downwards on upper surface 224U of primary heat sink 214.

Referring now to FIG. 3A, add-on heat sink 240A is locked to primary heat sink 214 by arms 250 of add-on heat sink 240A. For example, add-on heat sink 240A includes four arms 250. Referring now to a first arm 250-1 of the plurality of arms 250, arm 250-1 extends downwards from base section 244 of add-on heat sink 240A and around a side 224S of base section 224 of primary heat sink 214. Arm 250-1 includes a locking feature 254, which locks add-on heat sink 240A to primary heat sink 214. Primary heat sink 214 has been partially cutaway in the view of FIG. 3A for purposes of clarity of illustration only.

Figure 3B:
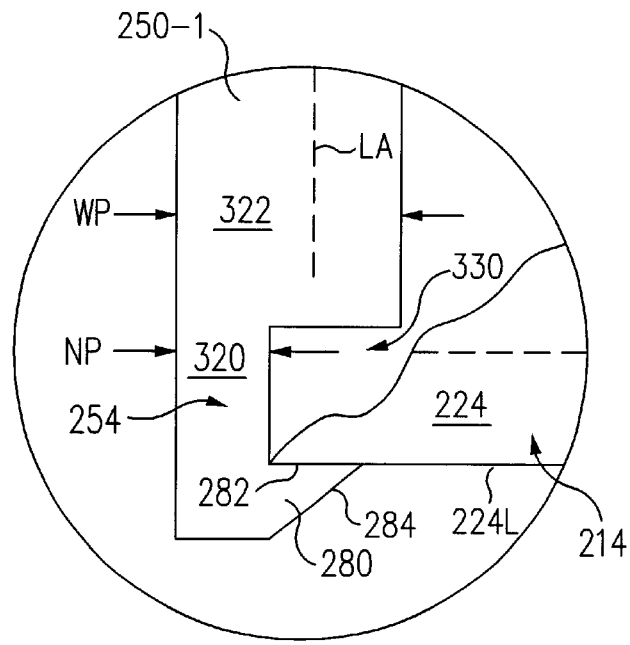
FIG. 3B is an enlarged side plan view, partially cutaway, of a region IIIB of FIG. 3A.

FIG. 3B is an enlarged side plan view, partially cutaway, of a region IIIB of FIG. 3A. Referring to FIG. 3B, in this embodiment, locking feature 254 is hook-shaped. More particularly, locking feature 254 includes a tab 280. Tab 280 includes a lip 282, i.e., a surface, perpendicular to the longitudinal axis LA of arm 250-1. For example, in the view of FIG. 3B, longitudinal axis LA of arm 250-1 is vertical and lip 282 is horizontal. Tab 280 extends inwards and under primary heat sink 214 such that lip 282 presses upwards against lower surface 224L of base section 224 of primary heat sink 214. Tab 280 also includes a taper 284, i.e., a surface, that facilitates sliding of tab 280 against primary heat sink 214 during mounting of add-on heat sink 240A, as discussed further below.

Arm 250-1 further includes a narrow portion 320 directly adjacent tab 280 and a wide portion 322 directly adjacent narrow portion 320. Narrow portion 320 has a width NP less than a width WP of wide portion 322. In this manner, a pocket 330 is defined by tab 280, narrow portion 320 and wide portion 322. Base section 224 of primary heat sink 214 is held in pocket 330. The other arms 250 have corresponding locking features 254, pockets 330 and generally are substantially similar to first arm 250-1 and so are not discussed to avoid detracting from the principals of the invention. However, as those of skill in the art will understand, the dimensions of each arm 250 can vary, e.g., the length, the size of pocket 320 and shape of tab 280, depend upon the particular design of primary heat sink 214.

In the above manner, referring again to FIG. 3A, arms 250 mount add-on heat sink 240A to primary heat sink 214. Further, tension in arms 250 causes add-on heat sink 240A to press downwards on primary heat sink 214. More particularly, tension in arms 250 cause ends 246E2, 24BE2 of walls 246, 248, respectively, of add-on heat sink 240A to press downwards on upper surface 224U of primary heat sink 214. In this manner, add-on heat sink 240A is pressed into thermal contact with primary heat sink 214.

Referring again to FIG. 2, second add-on heat sink 240B is substantially similar, or is the same, as first add-on heat sink 240A, and so is not discussed in detail to avoid detracting from the principals of the invention. Of importance, by using two add-on heat sinks, i.e., add-on heat sinks 240A and 240B, end 248E2 of wall 248 of add-on heat sink 240A and end 246E2 of wall 246 of add-on heat sink 240B press downwards on upper surface 224U of primary heat sink 214 directly opposite heat emitting component 210. Advantageously, add-on heat sinks 240A, 240B contact the hottest region of upper surface 224U of primary heat sink 214, i.e., the region of upper surface 224U directly opposite heat emitting component 210. In this manner, heat transfer between primary heat sink 214 and add-on heat sinks 240A, 240B is maximized. However, although first and second add-on heat sinks 240A, 240B, i.e., a plurality of add-on heat sinks, are illustrated and discussed above, in light of this disclosure, those of skill in the art will recognize that a single add-on heat sink, e.g., add-on heat sink 240A or add-on heat sink 240B, can be used.

Referring again to FIG. 2, add-on heat sinks 240A, 240B enhance heat transfer from primary heat sink 214 in several ways. First, since add-on heat sinks 240A, 240B are thermally connected to primary heat sink 214, the effective heat transfer surface area for dissipating heat to the ambient environment is increased compared to the surface area of primary heat sink 214 alone. More particularly, the effective heat transfer surface area is increased by the surface areas of add-on heat sinks 240A, 240B. As those of skill in the art will understand, increasing the effective heat transfer surface area increases heat dissipation to the ambient environment.

To further increase the heat transfer surface area, in one embodiment, add-on heat sinks 240A, 240B are finned heat sinks. For example, referring to FIG. 2, add-on heat sink 240A includes one or more fins 256 (indicated in dashed lines) on lower surface 244L. Fins 256 extend downwards from base section 244 towards primary heat sink 214. As a further illustration, add-on heat sink 240B includes one or more fins 258 (indicated in dashed lines) on an upper, e.g., second, surface 244U of base section 244 of add-on heat sink 240B. Fins 258 extend upwards from base section 244 away from primary heat sink 214.

In an alternative embodiment (not shown), add-on heat sink 240B includes one or more fins 256 on a lower surface 244L of base section 244 of add-on heat sink 240B. In another embodiment (not shown), add-on heat sink 240A includes one or more fins 258 on an upper surface 244U of base section 244 of add-on heat sink 240A. In yet another alternative embodiment (not shown), add-on heat sinks 240A, 240B both have one or more fins 256 on lower surfaces 244L of base sections 244 and also have one or more fins 258 on upper surfaces 244U of base sections 244.

Add-on heat sinks 240A, 240B also enhance heat transfer from primary heat sink 214 by improving airflow between fins 228 of primary heat sink 214. More particularly, add-on heat sinks 240A, 240B restrict air from flowing between primary heat sink 214 and a cabinet 260, which is spaced relatively far from substrate 212. In this manner, add-on heat sinks 240A, 240B force air to flow between fins 228 of primary heat sink 214, thus enhancing heat transfer from primary heat sink 214. In one embodiment, the distance between upper surfaces 244U of base sections 244 of add-on heat sinks 240A, 240B and upper surface 224U of primary heat sink 214 is 11.19 millimeters (mm).

Advantageously, add-on heat sinks 240A, 240B enhance heat transfer from primary heat sink 214 when the spacing between cabinet 260 and substrate 212 is sufficiently large such that primary heat sink 214 would otherwise be ineffective at cooling heat emitting component 210. By enhancing heat transfer from primary heat sink 214, add-on heat sinks 240A, 240B ensure that the temperature of heat emitting component 210 remains below the maximum allowable operating temperature of heat emitting component 210.

However, in the event that the spacing between cabinet 260 and substrate 212 is sufficiently small such that primary heat sink 214 alone is effective at cooling heat emitting component 210, add-on heat sinks 240A, 240B are not provided.

Advantageously, primary heat sink 214 is used with all spacings between cabinet 260 and substrate 212. In the event that the spacing between cabinet 260 and substrate 212 becomes sufficiently large such that primary heat sink 214 alone would be ineffective at cooling heat emitting component 210, only then are add-on heat sinks 240A, 240B provided. Accordingly, only a single primary heat sink 214 is stocked for all manufacturers.

Recall that in the prior art, a large number of different heat sinks had to be stocked to accommodate the different spacings between the cabinet and the substrate for the various manufacturers. Disadvantageously, stocking a large number of different heat sinks was cost prohibitive.

Alternatively, in the prior art, a single heat sink having relatively short fins was used for all manufacturers regardless of the spacing between the cabinet and the substrate. To enhance heat transfer from the heat emitting component and heat sink when the spacing between the cabinet and substrate became relatively large, additional and/or more powerful fans were used. Disadvantageously, these additional and/or more powerful fans consumed more power, which increased the operating cost of the computer system. Further, these additional and/or more powerful fans resulted in an increase in noise, which was detrimental to the performance of the computer system.

In contrast, heat sink structure 200 provides effective cooling of heat emitting component 210 even when the spacing between cabinet 260 and substrate 212 becomes relatively large. Effective cooling of heat emitting component 210 is achieved using only a single primary heat sink 214 for all manufacturers. Further, effective cooling of heat emitting component 210 is achieved without having to power a fan and without generating noise. Accordingly, the prior art requirements of stocking a large number of heat sinks and providing additional and/or more powerful fans are eliminated.

Figure 4:
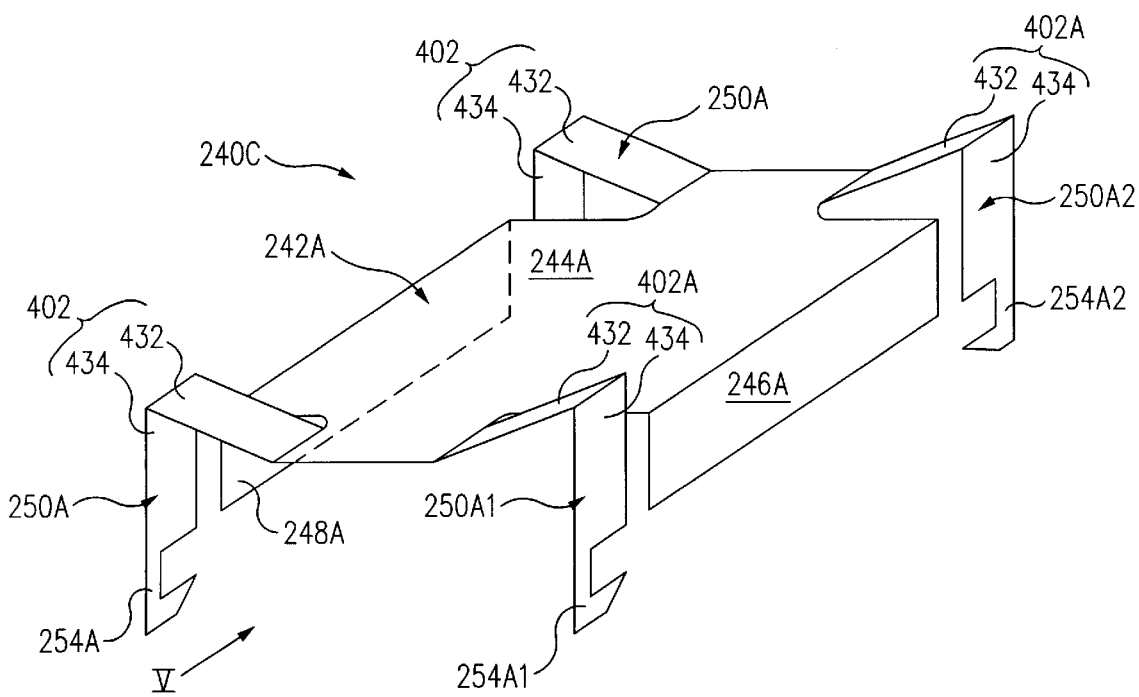
FIG. 4 is a perspective view of an add-on heat sink in accordance with an alternative embodiment of the present invention.
Figure 5:
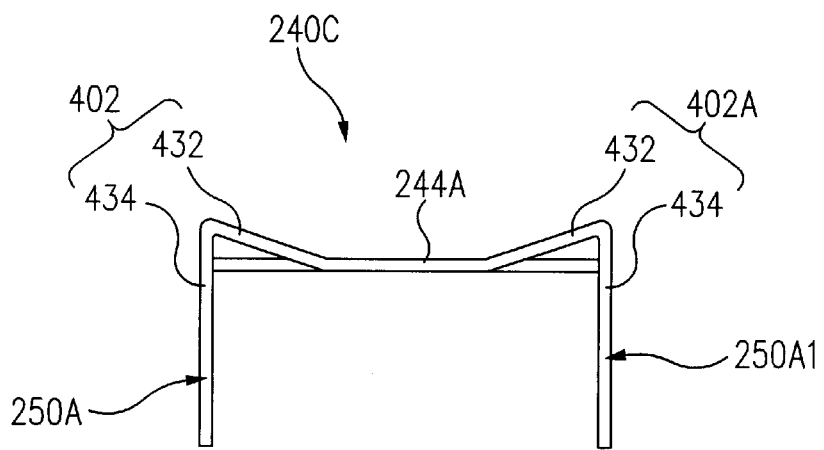
FIG. 5 is a front plan view along the line V of the add-on heat sink of FIG. 4.

FIG. 4 is a perspective view of an add-on heat sink 240C in accordance with an alternative embodiment of the present invention. FIG. 5 is a front plan view along the line V of add-on heat sink 240C of FIG. 4. Referring to FIGS. 4 and 5 together, in one embodiment, add-on heat sink 240C is formed from a single piece of metal such as anodized aluminum having a thickness of 1.0 mm. For example, a single piece of metal is stamped and bent to form add-on heat sink 240C, as those of skill in the art will understand. Accordingly, add-on heat sink 240C is integral, i.e., is a single piece and not a plurality of separate pieces connected together. Generally, add-on heat sink 240C is made of a flexible resilient material having a high spring rate. Thus, add-on heat sink 240C has the ability to return to its original form, i.e., relaxed state, after being forced out of shape.

Add-on heat sink 240C includes a body portion 242A formed by a base section 244A and walls 246A, 248A connected to base section 244A. Base section 244A, walls 246A, 248A are similar to base section 244, walls 246, 248 of FIGS. 2, 3A and so are not discussed further to avoid detracting from the principals of the invention.

Referring still to FIGS. 4 and 5 together, add-on heat sink 240C includes four arms 250A attached to base section 244A. In accordance with this embodiment, arms 250A includes spring elements 402 and locking features 254A.

To illustrate, a first arm 250A1 of the plurality of arms 250A includes a first spring element 402A of the plurality of spring elements 402 and a first locking feature 254A1 of the plurality of locking features 254A. Spring element 402A includes a spring arm 432 and a riser arm 434 integrally connected together. Spring arm 432 is integrally connected to and extends from base section 244A and riser arm 434 is integrally connected to locking feature 254A1. The other arms 250 are similar to arm 250A1 and so are not discussed in detail to avoid detracting from the principals of the invention.

Of importance, add-on heat sink 240C is mounted in a simple yet reliable manner. FIG. 6 is a side plan view, partially cutaway, of a heat sink structure 600 formed with add-on heat sink 240C of FIGS. 4, 5 during assembly in accordance with one embodiment of the present invention. Referring now to FIG. 6, to mount add-on heat sink 240C to primary heat sink 214, add-on heat sink 240C is positioned in its relaxed state such that locking features 254A are substantially aligned with sides 224S of base section 224 of primary heat sink 214. To illustrate, a first locking feature 254A1 and a second locking feature 254A2 of the plurality of locking features 254A are substantially aligned with sides 224S of base section 224 of primary heat sink 214.

FIG. 7 is a side plan view, partially cutaway, of heat sink structure 600 at a further stage of assembly. Referring now to FIG. 7, add-on heat sink 240C (including arms 250) is pressed towards primary heat sink 214. This causes arm 250A1 to be spread apart from a second arm 250A2, opposite arm 250A1. More particularly, tapers 284 of tabs 280 of arms 250A1, 250A2 slide against base section 224 of primary heat sink 214 causing arms 250A1, 250A2 to be spread apart from one another.

As a result of this displacement of arms 250A1, 250A2, arms 250A1, 250A2 pressed inwards towards one another and against base section 224 of primary heat sink 214. Arms 250A1, 250A2 are moved downwards towards primary heat sink 214 until lips 282 of tabs 280 reach lower surface 224L of base section 224. Upon reaching lower surface 224L, tabs 280 snap inwards towards one another and around primary heat sink 214 such that lips 282 engage lower surface 224L of primary heat sink 214 in a manner similar to that illustrated in FIG. 3A. Stated another way, arms 250A1, 250A2 are moved downwards towards primary heat sink 214 until locking features 254A are locked to base section 224 of primary heat sink 214.

At this point, add-on heat sink 240C is locked to primary heat sink 214. Of importance, referring still to FIG. 7, tension generated in arms 250A1, 250A2 causes tabs 280 to be firmly pressed under primary heat sink 214.

Spring elements 402 (FIGS. 4, 5) are under tension as a result of being bent during mounting (FIGS. 6, 7) of add-on heat sink 240C to primary heat sink 214. Advantageously, referring now to FIG. 7, this tension causes add-on heat sink 240C to press downwards on primary heat sink 214. More particularly, tension in arms 250A cause ends 246E2, 248E2 of walls 246A, 248A, respectively, and, more generally, body portion 242A of add-on heat sink 240C to press downwards on upper surface 224U of primary heat sink 214. In this manner, add-on heat sink 240C is pressed into thermal contact with primary heat sink 214. More particularly, body portion 242A is in thermal contact with primary heat sink 214.

Further, add-on heat sink 240C is easily dismounted from primary heat sink 214. More particularly, arms 250A1, 250A2 are pulled apart from one another such that lips 282 disengage lower surface 224L of primary heat sink 214. Once clear of primary heat sink 214, tension in arms 250A1, 250A2 causes arms 250A1, 250A2 to move upwards. At this point, add-on heat sink 240C is simply lifted off of primary heat sink 214.

Although locking of arms 250A1, 250A2 to primary heat sink 214 during mounting of add-on heat sink 240C is described above, it is understood that all four arms 250A are locked simultaneously, or one at a time, to primary heat sink 214 in a similar manner. Further, although mounting of a single add-on heat sink 240C is described above, it is understood that more than one add-on heat sink can be mounted to primary heat sink 214 in a similar manner.

Advantageously, mounting of add-on heat sink 240C to primary heat sink 214 is simple yet reliable. Accordingly, the cost associated with mounting add-on heat sink 240C to primary heat sink 214 are minimal. Further, add-on heat sink 240C is mounted without making any modifications to primary heat sink 214. Thus, by properly sizing add-on heat sink 240C, add-on heat sink 240C can be readily used with a wide variety of commercially available primary heat sinks.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

I claim:

1. A heat sink structure comprising:
    a base section;
    a first wall connected to said base section;
    a first arm connected to said base section, said first arm comprising:
        a locking feature;
        a spring arm connected to said base section; and
        a riser arm connected to said locking feature, said spring arm and said riser arm being connected together; and
    a second arm connected to said base section.

2. The structure of claim 1 wherein said first wall is substantially perpendicular to a first surface of said base section.

3. The structure of claim 1 wherein said locking feature is hook-shaped.

4. The structure of claim 1 wherein said locking feature comprises a tab, said tab comprising:
    a lip; and
    a taper.

5. The structure of claim 1 further comprising a second wall connected to said base section.

6. The structure of claim 5 further comprising four arms, said four arms comprising said first arm and said second arm.

7. A heat sink structure comprising:
   a base section;
   a first wall connected to said base section;
   a first arm connected to said base section, said first arm comprising a first locking feature;
   a second arm connected to said base section, said second arm comprising a second locking feature; and
   one or more fins on a first surface of said base section.

8. The structure of claim 7 further comprising one or more fins on a second surface of said base section.

9. A structure comprising:
   a heat emitting component;
   a primary heat sink in thermal contact with said heat emitting component; and
   a first add-on heat sink comprising arms and a body portion, said arms locking said first add-on heat sink to said primary heat sink, said body portion being in thermal contact with said primary heat sink, said arms comprising a first arm, said first arm comprising:
      a spring arm connected to a first base section of said body portion; and
      a riser arm connected to said spring arm.

10. The structure of claim 9 wherein said body portion further comprises:
   a first wall connected to said first base section; and
   a second wall connected to said first base section.

11. The structure of claim 10 wherein said primary heat sink comprises:
   a second base section, a first surface of said second base section being in thermal contact with said heat emitting component; and
   a plurality of fins on a second surface of said second base section.

12. The structure of claim 11 wherein an end of said first wall presses on said second surface of said second base section and wherein an end of said second wall presses on said second surface of said second base section.

13. The structure of claim 12 wherein said end of said first wall presses on said second surface of said second base section directly opposite said heat emitting component.

14. The structure of claim 9 wherein said first arm further comprises a locking feature.

15. The structure of claim 14 wherein said locking feature comprises a tab, said tab comprising:
   a lip perpendicular to a longitudinal axis of said first arm; and
   a taper.

16. A structure comprising:
   a heat emitting component;
   a primary heat sink in thermal contact with said heat emitting component;
   a first add-on heat sink comprising arms and a body portion, said arms locking said first add-on heat sink to said primary heat sink, said body portion being in thermal contact with said primary heat sink, said body portion comprising:
      a first base section;
      a first wall connected to said first base section;
      a second wall connected to said first base section; and
      one or more fins on a first surface of said first base section.

17. The structure of claim 16 further comprising one or more fins on a second surface of said first base section.

18. A structure comprising:
   a heat emitting component;
   a primary heat sink in thermal contact with said heat emitting component;
   a first add-on heat sink comprising arms and a body portion, said arms locking said first add-on heat sink to said primary heat sink, said body portion being in thermal contact with said primary heat sink directly opposite said heat emitting component; and
   a second add-on heat sink comprising arms and a body portion, said arms of said second add-on heat sink locking said second add-on heat sink to said primary heat sink, said body portion of said second add-on heat sink being in thermal contact with said primary heat sink directly opposite said heat emitting component.

19. A method of mounting an add-on heat sink to a primary heat sink comprising:
   positioning said add-on heat sink such that locking features of said add-on heat sink are aligned with sides of a base section of said primary heat sink;
   pressing said add-on heat sink towards said primary heat sink such that a first arm of said add-on heat sink is spread apart from a second arm of said add-on heat sink; and
   locking lips of said locking features to a first surface of said base section of said primary heat sink to thermally connect a body portion of said add-on heat sink to a second surface of said base section of said primary heat sink opposite said first surface, said first surface of said base section of said primary heat sink being in thermal contact with a heat emitting component.

20. The method of claim 19 wherein said pressing causes a taper of said first arm to slide against said base section.

21. The method of claim 19 wherein said locking comprises moving said first arm and said second arm towards said primary heat sink.

22. The method of claim 21 wherein said lips comprise a first lip of a first tab of said first arm and a second lip of a second tab of said second arm, wherein said first arm and said second arm are moved towards said primary heat sink until said first lip of said first tab of said first arm and said first lip of said first tab of said second arm reach said first surface of said base section.

23. The method of claim 22 wherein, upon said first lip of said first tab of said first arm reaching said first surface of said base section, said first tab of said first arm snaps inwards towards said first tab of said second arm.

24. The method of claim 23 wherein said first tab of said first arm snaps around said primary heat sink.

25. The method of claim 23 wherein said first lip of said first tab of said first arm engages said first surface of said primary heat sink.

26. The method of claim 21 wherein tension in said arms causes said body portion of said add-on heat sink to press against said second surface of said base section of said primary heat sink.

27. A structure comprising:
   a heat emitting component;
   a primary heat sink comprising a base section having a first surface in thermal contact with said heat emitting component; and
   a first add-on heat sink comprising arms and a body portion, said arms comprising lips engaged with said first surface of said base section of said primary heat sink, said body portion being in thermal contact with a second surface of said base section of said primary heat sink opposite said first surface.

* * * * *